(12) United States Patent
Sasaki et al.

(10) Patent No.: US 7,750,540 B2
(45) Date of Patent: Jul. 6, 2010

(54) PIEZOELECTRIC ACTUATOR AND ELECTRONIC DEVICE

(75) Inventors: Yasuhiro Sasaki, Tokyo (JP); Yasuharu Oonishi, Tokyo (JP); Jun Kuroda, Tokyo (JP); Yukio Murata, Tokyo (JP); Ukyou Mori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/281,974

(22) PCT Filed: Feb. 20, 2007

(86) PCT No.: PCT/JP2007/053032

§ 371 (c)(1),
(2), (4) Date: Sep. 5, 2008

(87) PCT Pub. No.: WO2007/102305

PCT Pub. Date: Sep. 13, 2007

(65) Prior Publication Data

US 2009/0045700 A1    Feb. 19, 2009

(30) Foreign Application Priority Data

Mar. 7, 2006  (JP) .............................. 2006-061161

(51) Int. Cl.
 *H01L 41/08* (2006.01)
(52) U.S. Cl. ...................... 310/348; 310/330
(58) Field of Classification Search .......... 310/330–332
See application file for complete search history.

(56) References Cited

U.S. PATENT DOCUMENTS

| 6,198,206 | B1* | 3/2001 | Saarmaa et al. ............. 310/340 |
| 2005/0023937 | A1* | 2/2005 | Sashida et al. ............. 310/348 |

FOREIGN PATENT DOCUMENTS

| JP | 9-271096 A | 10/1997 |
| JP | 10-340086 A | 12/1998 |
| JP | 2002-507849 A | 3/2002 |
| JP | 2005-45691 A | 2/2005 |
| JP | 2005-160028 A | 6/2005 |

OTHER PUBLICATIONS

"Applications of Piezoelectric Ceramics" p. 71, Gakken Sha (1989).

* cited by examiner

*Primary Examiner*—Mark Budd
(74) *Attorney, Agent, or Firm*—Sughrue Mion, PLLC

(57) ABSTRACT

There is provided a piezoelectric actuator and the like capable of efficiently transmitting vibration between an object (e.g., a housing of an electronic device) and a piezoelectric ceramic vibrator. The piezoelectric actuator 50A includes a piezoelectric ceramic vibrator 15 and a holder 12 to hold an edge section thereof and functions as, for example, a vibrator by propagating deflective vibration of the vibrator 15 via the holder 12 to an elastic body 14 as the object. A subsidiary holder 13 is disposed between the vibrator 15 and the elastic body 14, and part of the deflective vibration of the vibrator 15 is propagated via the elastic body 14.

11 Claims, 12 Drawing Sheets

F I G. 1
(a)
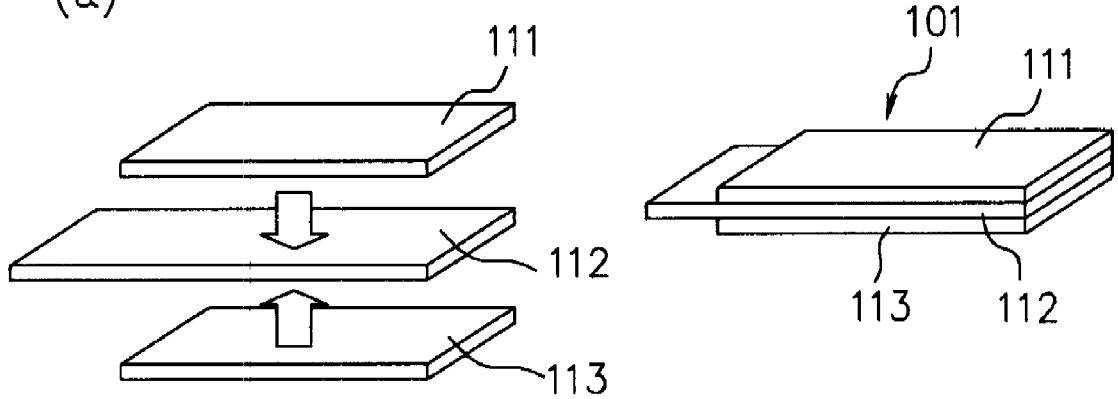
(b)
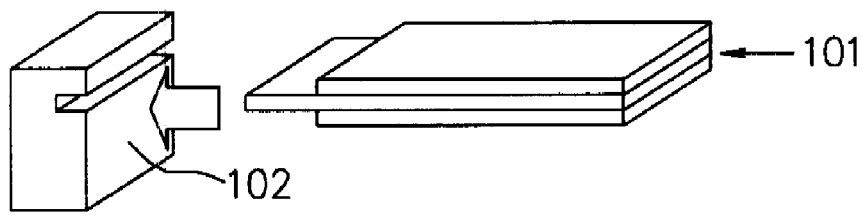
(c)
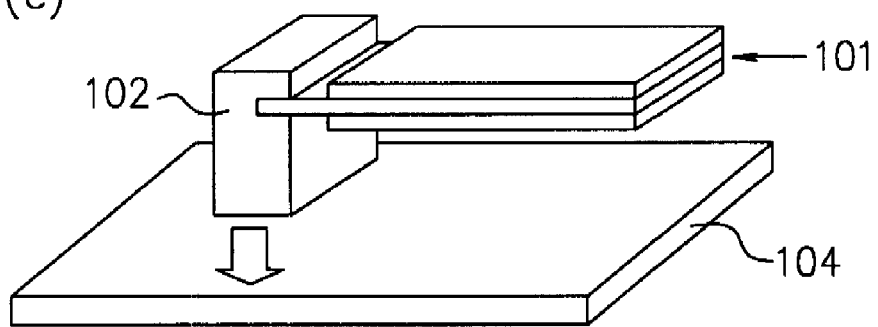

(a)

(b)

F I G. 9
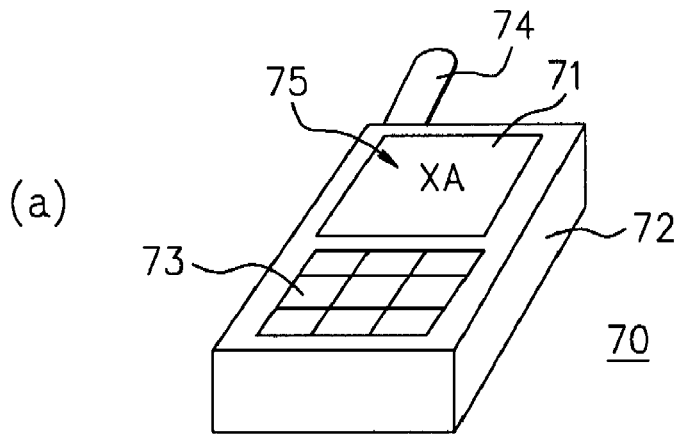
F I G. 10
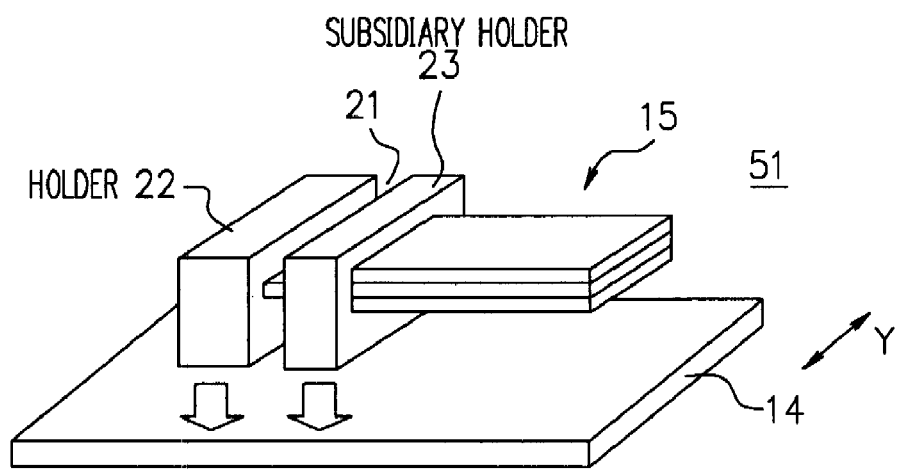

F I G. 16
(a)
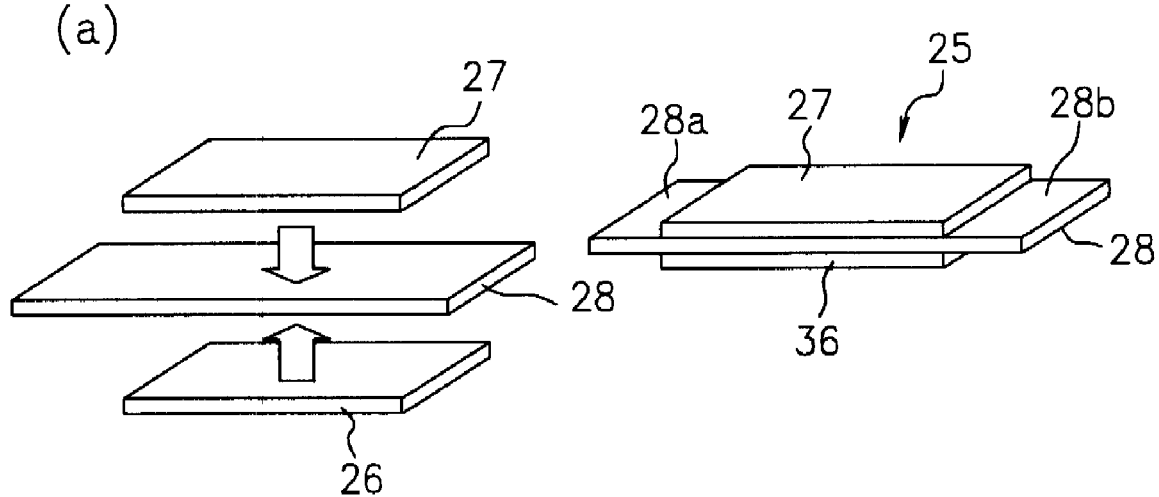
(b)
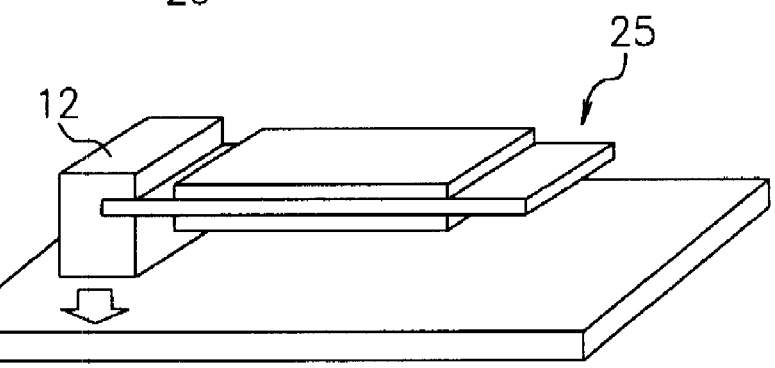
(c)
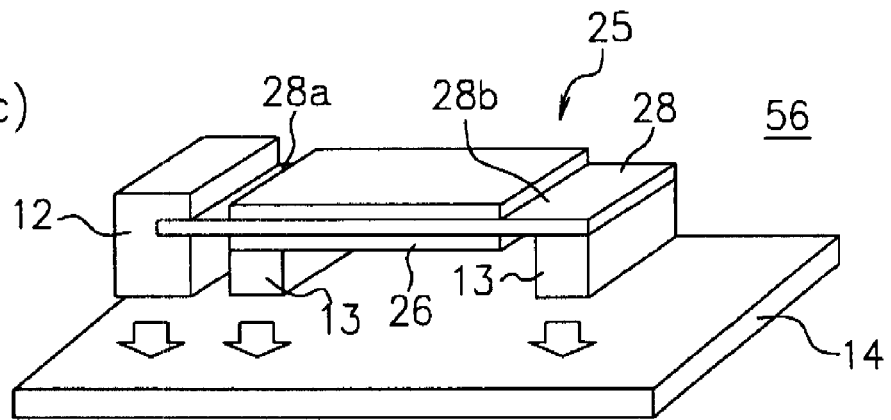

F I G. 17
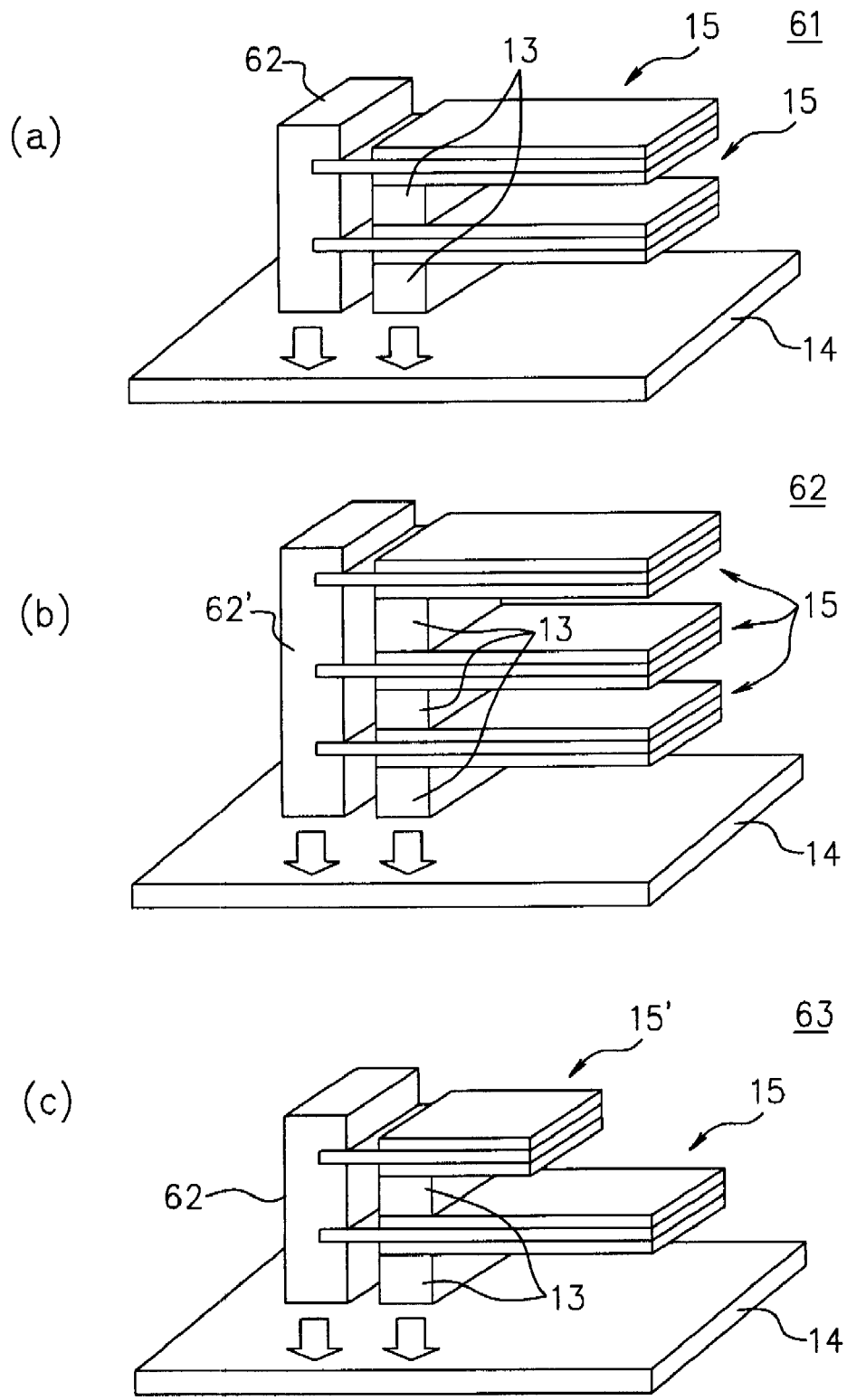

PIEZOELECTRIC ACTUATOR AND ELECTRONIC DEVICE

TECHNICAL FIELD

The present invention relates to a piezoelectric actuator used as a vibrator of, for example, a cellular or the like and to an electronic device with the actuator mounted therein.

RELATED ART

Today, there have been increasingly employed small-sized electronic devices having portability such as a cellular, a notebook-type personal computer, and a PDA. With development of networks and software, these devices show wide applications thereof and hence increase usability for users. This resultantly increases importance of high-performance devices which correctly transmit information using vibration and sound waves at any places; for parts including vibrating parts for a vibrator, a vibration sensor, and a touch sensor and acoustic parts for a speaker, a microphone, and a receiver, there have been expected improvement of quality in transmission of vibration and acoustic signals and downsizing of parts. As a vibration source for electronic devices having portability, a vibration source of a piezoelectric ceramic type has been adopted from a viewpoint of low consumption power and downsizing.

FIG. 1 shows a piezoelectric actuator employing flectional vibration of a conventionally representative rectangular piezoelectric ceramic vibrator. The actuator of FIG. 1 includes a piezoelectric ceramic vibrator 101 including two thin piezoelectric ceramic plates 111 and 113 pasted onto both surfaces of a planar shim member 112. The vibrator 101 is fixed via a holder 102 onto a housing 104 of an electronic device in the configuration (reference is to be made to non-patent document 1 for such configuration).

In the piezoelectric actuator thus constructed, when one of the two ceramic plates expands its longitudinal direction and the other one thereof contracts at the same time, the vibrator 101 flectionally deforms in the direction of thickness. Concretely, when an alternating-current electric field is applied to the vibrator 101, the vibrator flectionally vibrates (deflectively vibrates). When vibration of the vibrator 101 thus caused is transmitted via the holder 102 to the housing 104, there is implemented a function of a vibrator or an acoustic element.

Next, description will be given of a piezoelectric actuator disclosed in patent document 1 by referring to FIG. 2. As shown in FIG. 2(a), two piezoelectric ceramic vibrators 201 are housed in spaces 231, respectively. Each vibrator 201 includes piezoelectric ceramic plates 211 and 213 pasted onto both surfaces of a shim member 212, and one end thereof is held by a holding section 206 in a cantilevered fashion. In the piezoelectric actuator configured as above, vibration of each vibrator is imparted via the holding section 206 to the housing (case).

FIG. 2(b) is a magnified view of a periphery of the holding section of FIG. 2(a). In the document, as shown in the drawings, there is described that the vibrators are fixed by forming an adhesive agent layer 209 between an inner wall surface of the case and each vibrator.

Non-Patent Document 1: "Applications of Piezoelectric Ceramics", Gakken Sha, 1989, p. 71

Patent Document 1: Japanese Patent Laid-Open Publication Ser. No. 2005-160028

DISCLOSURE OF THE INVENTION

Problem to be Solved by the Invention

Incidentally, electric devices having portability such as a PDA, a small-sized PC, and a cellular must operate in an environment of noise in a busy street and in closed spaces such as a bag and a pocket of clothes. Hence, to enable transmission of signals to the user by vibration and/or sound waves, it is required to increase quantity of vibration or to increase exciting force of a vibration source used in the electronic devices. However, since the electronic device having portability is highly frequently used, the housing is designed to have high rigidity; to obtain quantity of vibration of a level to be perceived by the user of the electronic device, the vibration force requires strong exciting force.

Now, referring to FIG. 3, description will be specifically given of a vibration mode of a piezoelectric actuator of the related art (reference is to be made to FIG. 1). Vibration caused by the flectional vibration of the piezoelectric ceramic vibrator propagates via the holder 102 to the elastic body 104 such as the housing connected to the holder.

The vibration propagates in the holder section as follows. That is, the vibration of the vibrator causes moment of rotation M in the root of the holder 102; due to this moment of rotation M, force acts upon the principal surface of the housing 104 in other than the perpendicular direction, which hence results in deflective deformation in the housing 104.

However, since a component of inertial force of the piezoelectric ceramic vibrator 101 in the surface direction or the horizontal direction with respect to the principal surface of the elastic body 104 acts upon the connecting section of the holder 102, mechanical deflective vibration takes place in the horizontal direction in the vicinity of the connecting section between the holder and the piezoelectric ceramic vibrator. That is, the holder 102 includes a vibration component in the horizontal direction other than the surface direction of the principal surface of the elastic body.

As above, when energy of the vibration source is used for the vibration component in the horizontal direction not effective in the transmission of vibration to the elastic body 104, the quantity of vibration propagated to the elastic body 104 is lowered. That the quantity of vibration is lowered in this way means that the exciting force of the piezoelectric actuator to the elastic body 104 is lowered.

Next, as for the configuration of FIG. 2, the holding section 206 precisely includes an upper section 206a, a middle section 206b, and a lower section 206c as shown in FIG. 2(a). In such configuration, since the holding section 206 is constructed integrally together with an exterior case, the vibration energy leaks into the exterior case, reducing the amount of vibration energy imparted to the electronic device. That is, there exists a problem that sufficient quantity of vibration cannot be obtained.

On the other hand, as an application of the function in which vibration from a fingertip or voice of the user is sensed to process information, there exist simple and highly sensitive interface functions coupling the user to the electronic device such as a touch panel input function and an automatic voice recognition function. These functions are placed at much more important positions as the ubiquitous society is approaching. To sense vibration and sound waves, a vibration pickup and a microphone of electromagnetic type are conventionally adopted; for example, there exist a device to detect a change in electrostatic capacity between electrodes and a device to detect a current induced in a winding coil according to vibration and a sound wave.

Since these are mounted on an electronic device having portability such as a PDA and a cellular for which space saving is required, it is necessary to reduce areas thereof; as a result, there exists a problem that sensitivity is lowered. In contrast thereto, it is known that the piezoelectric-type device has a piezoelectric effect with high sensitivity to convert vibration into a voltage; however, in a sensor employing the conventional piezoelectric actuator, efficiency of vibration transmission is relatively low, and it has been desired to improve the efficiency of vibration transmission.

The present invention has been devised in consideration of the problem and aims at providing a piezoelectric actuator and an electronic device with the same mounted therein, the actuator being capable of efficiently transmitting vibration between an object (e.g., a housing of the electronic device) and a piezoelectric ceramic vibrator.

Means for Solving the Problem

In order to solve the problem, a piezoelectric actuator of the present invention is a piezoelectric actuator including a piezoelectric ceramic vibrator in which a piezoelectric layer is arranged on both surfaces of a shim body and a holder for holding an edge section of the piezoelectric ceramic vibrator, wherein deflective vibration of the piezoelectric ceramic vibrator is propagated via the holder to an object, and at least one subsidiary holder is disposed, at a position between the piezoelectric ceramic vibrator and the object when the holder is attached onto the object, with a gap between the subsidiary holder and the holder; and part of the deflective vibration of the piezoelectric ceramic vibrator is propagated via the subsidiary holder to the object.

In accordance with the piezoelectric actuator of the present invention constructed in this way, since deflective vibration of the piezoelectric ceramic vibrator is propagated via both of the holder and the subsidiary holder to an object (e.g., a housing), the vibration is efficiently transmitted. Also, the subsidiary holder is fixed onto the piezoelectric ceramic vibrator; hence, as compared with the conventional configuration, the vibration component imparted from the vibrator to the holder in the horizontal direction is lowered; also in this point, the transmission efficiency of vibration between the vibrator and the object is improved.

ADVANTAGES OF THE INVENTION

As described above, according to the piezoelectric actuator of the present invention, since the subsidiary holder is disposed, the vibration transmission efficiency is improved and the vibration is appropriately transmitted between the object (e.g., a housing of an electronic device) and the piezoelectric ceramic vibrator.

BEST MODE FOR CARRYING OUT THE INVENTION

Next, description will be given of exemplary embodiments of the present invention by referring to drawings.

First Exemplary Embodiment

FIG. 4 is a perspective view showing a configuration example of a piezoelectric actuator in a first exemplary embodiment in which FIG. 4(a) shows a disassembled state and FIG. 4(b) shows substantially a completed state.

As FIG. 4 shows, the piezoelectric actuator 50A of the exemplary embodiment includes a piezoelectric ceramic vibrator 15 and a holder 12 to hold the piezoelectric ceramic vibrator 15 and further includes a subsidiary holder 13 arranged between the vibrator 15 and an elastic body 14. The actuator 50A is used by being attached onto the elastic body 1 which is, for example, a housing of an electronic device.

In the configuration of the piezoelectric ceramic vibrator 15, two thin piezoelectric ceramic plates 16 and 17 are pasted onto both surfaces of a planar shim member 18. The ceramic plates (piezoelectric layers) 16 and 17 are pasted onto the shim member 18 leaving only an area 18a on one edge side of the shim plate 18. On an upper side of the holder 12, there is formed a groove 12a in which the shim plate 18 is inserted to be fixed therein.

The subsidiary holder 13 is configured in a size to be in contact with both of the elastic body 14 and the ceramic plate 16 in a state in which the piezoelectric actuator 50A is attached onto the elastic plate 14. The subsidiary holder 13 is fixed onto each of the piezoelectric ceramic vibrator 15 and the elastic body 14; for the fixing, there may be used, for example, an adhesive. By disposing the subsidiary holder 13 of this kind, a vibration transmitting path to the elastic body 14 is additionally disposed as compared with a configuration not including the subsidiary holder 13, which will be described later.

The subsidiary holder 13 is preferably made of a material which is, although not particularly limitative, an elastic organic material such as ABS and rubber. Since the subsidiary holder 13 is a member to be brought into contact with the ceramic plate 16 made of a brittle material, if the subsidiary holder 13 includes quite a hard material, micro-cracks likely occur when the holder 13 is fixed onto the ceramic plate 16.

The subsidiary holder 13 is arranged at a position apart a predetermined distance from the holder 12, and a gap 11 is disposed between the holders 12 and 13. If the subsidiary holder 13 and the holder 12 are arranged to stick to each other without any gap therebetween, the vibrator 15 does not bend at its root section; and the obtained quantity of vibration is reduced as a result. On the other hand, if the gap 11 is secured as in this exemplary embodiment, the vibrator can appropriately deflect in the gap 11, and hence the obtained quantity of vibration is also sufficient.

Incidentally, the distance between the subsidiary holder 13 and the holder 12 is not particularly limited, for example, may be in configurations shown in FIGS. 5 and 6. In the piezoelectric actuator 50B of FIG. 5, the subsidiary holder 13 is disposed at a position slightly near the holder 12 relative to a central line CL in the longitudinal direction (the horizontal direction in FIG. 5) of the piezoelectric ceramic plate 17. In the piezoelectric actuator 50C of FIG. 6, the subsidiary holder 13 is disposed at a position slightly apart from the holder 12 relative to the central line CL.

Referring next to FIG. 7, description will be given of operation of the piezoelectric actuator of the exemplary embodiment configured as above. FIG. 7 is a schematic diagram to explain the operation of the piezoelectric actuator of FIG. 4.

In the configuration of the present embodiment, vibration of the piezoelectric ceramic vibrator 15 is transmitted via the holder 12 to the elastic body 14 (reference is to be made to an arrow a) and moreover is transmitted also via the subsidiary holder 13 to the elastic body 14 (reference is to be made to an arrow b). Since there exist two vibration transmission paths (while there exists one vibration transmission path in the related art), the transmission efficiency is improved for the elastic body 14 and hence the exciting force is highly increased.

Additionally, since the subsidiary holder 13 is arranged, the motion of the vibrator 15 is restricted in the horizontal direction thereof, and the horizontal directional vibration component which appears in the conventional piezoelectric actuator due to force of inertia of the piezoelectric vibrator does not easily takes place. Suppression of occurrence of horizontal directional vibration component as above indicates improvement in the efficiency of transmission of vibration from the vibrator 15 to the elastic body 14.

In this regard, the piezoelectric actuator above (50A as an example) is available as an acoustic element and a vibrator. That is, in conjunction with the configuration of FIG. 7, vibration transmitted from the vibrator 15 to the housing (14) can be used as sound or as vibration of a vibrator. Conversely, by employing the housing (14) of an electronic device as a receiving plane of vibration or sound wave, it is also possible to construct a vibration sensor or an acoustic sensor. In this situation, external vibration is transmitted via the holders 12 and 13 to the vibrator 15, and vibration thereof is converted into an electric signal.

Referring to FIG. 8, description will be given of further another mode of the present embodiment. According to the present invention, as in a piezoelectric actuator 50D of FIG. 8(a), there may be included a subsidiary holder 13' with length $L_{13}$ in the X direction is larger than the length $L_{12}$ of the holder. Furthermore, as in a piezoelectric actuator 50E of FIG. 8(b), there may be included a subsidiary holder 13" having a further greater length.

Even in this configuration, which is common with the above configuration in that the number of vibration transmission paths is increased by disposing the subsidiary holder as compared with the conventional configuration (only one transmission path) and that a predetermined gap is disposed between the subsidiary holder and the holder 12, there can be obtained an advantage in operation similar to that described above. Particularly, in the configuration shown in FIG. 8, since the area of contact between the subsidiary holder 13 and the elastic body 14 is increased, there is obtained an advantage that the transmitted vibration is increased and the exciting force is increased.

Also, FIGS. 4 to 8 do not show an electronic device in which the piezoelectric actuator is mounted; however, the electronic device may be, for example, a cellular as shown in FIG. 9 (which will be described later in detail). In the electronic device such as the cellular, if the piezoelectric actuator in accordance with the present invention is adopted as a vibration source coupled with the housing, vibration is efficiently transmitted to the overall housing. When a single-frequency alternating-current voltage is applied to the actuator, the device functions as a vibrator which notifies an incoming call to the user. When a voice/sound or a music signal is applied thereto, the device functions as a speaker or a receiver in which a sound is emitted from the entire housing.

Piezoelectric ceramics have a property in which when a voltage is applied thereto, the ceramics vibrate, and also a property called a piezoelectric effect to convert vibration into a voltage. The subsidiary holder of the piezoelectric actuator of the present invention improves the vibration transmission efficiency. When an external vibration or sound wave is propagated to a housing of an electronic device having a wide receiving surface, a vibration is excited in the overall housing; and the piezoelectric actuator converts a vibration signal of the vibration into a voltage signal, which implements a vibration/acoustic sensor having high sensitivity.

Second Exemplary Embodiment

The present invention is not restricted by the configuration of the above exemplary embodiment and allows various modifications. Next, in association therewith, description will be given of several exemplary embodiments using examples thereof. In this connection, in the drawings to be referred to hereinbelow, the same constituent sections of the same functions are assigned with the same reference numerals, and duplicated description will be avoided. Also, naturally, configurations shown in respective exemplary embodiments may be appropriately combined with each other.

In the piezoelectric actuator of the present invention, the contours of the holder and the subsidiary holder are not restricted by those described above, but may be as shown in FIGS. 10 to 12. In the exemplary embodiment, the depth (the size thereof in the direction of an arrow Y in FIG. 10) of the holder 12 is substantially equal to that of the vibrator 16; however, the depth of a holder 22 of FIG. 10 is longer than that of the vibrator 15.

Furthermore, for the subsidiary holder, the configuration thereof is not limited to the configuration in which the subsidiary holder 13 is pushed into a space between the vibrator 15 and the elastic body 14 as in the exemplary embodiment, but may be a configuration wherein the subsidiary holder is like a subsidiary holder 23 of FIG. 10 in which the vibrator 15 is inserted into a slit, now shown, disposed in the holder 23. Between the holder 22 and the subsidiary holder 23, that is, in the periphery of the root section of the vibrator 15, a predetermined gap 21 is arranged.

In a piezoelectric actuator 52A of FIG. 11, there is employed an integrated holder member in which a holder 32 and a subsidiary holder 33 disposed with a predetermined gap 31 therebetween are mutually connected via a connecting section 39 to each other in their lower sections. A piezoelectric actuator 52B of FIG. 12 is structurally common with FIG. 11 in that there is used an integrated holder member, but is different in that a holder 42 and a subsidiary holder 43 are mutually connected via a connecting section 49 to each other at two positions, i.e., an upper position and a lower position. In other words, a through hole (41) is arranged in one block-shaped holder member in the configuration.

As shown in FIGS. 11 and 12, when the holder and the subsidiary holder are constructed in one member, it is not required to connect the holder and the subsidiary holder respectively to the piezoelectric ceramic vibrator, leading to an advantage in which the process time is reduced and the production cost is lowered. In addition, in such configuration, it is possible to use, for example, a resin mold method to produce the holder, and it is favorable to employ one and the same material for the holder and the subsidiary holder. Even if the holder and the subsidiary holder are constructed in one unit, the advantage in accordance with the present invention can be obtained in the same way as for the exemplary embodiment described above.

Third Exemplary Embodiment

The present invention is not restricted by the exemplary embodiments above, but two or more subsidiary holders may be arranged as in a configuration of FIG. 13. A piezoelectric actuator 53A of FIG. 13(a) is an example in which the configuration of the actuator shown in FIG. 4(b) is used as its base and one subsidiary holder 13 is additionally disposed. The distance between the holder 12 and the subsidiary holder 13 is almost equal to the distance between the subsidiary holders 13.

A piezoelectric actuator 53B of FIG. 13(b) is an example in which one subsidiary holder 13 is additionally arranged in the configuration of FIG. 13(a); as a result, three subsidiary holders 13 are employed. A piezoelectric actuator 53C of FIG.

13(c) is an example in which the piezoelectric actuator 50D shown in FIG. 8(a) is used as its base and one subsidiary holder 13 is additionally disposed at an end section (an end section on a free edge side) of the vibrator 15.

Even in the configuration in which a plurality of subsidiary holders are disposed as above, the advantage obtained due to increase in the number of vibration transmission paths by disposing the subsidiary holders is similar to that of the exemplary embodiments above. Incidentally, comparing the configuration of FIG. 13 with that previously shown in FIG. 8, both are common in that the total contact area between the subsidiary holder and the elastic plate is increased, but the configuration of FIG. 13 is advantageous as follows. That is, if the several, separated subsidiary holders are connected onto a constant area of the piezoelectric ceramic vibrator, the number of locations in which the subsidiary holders are not connected to the vibrator increases as compared with a case wherein a block-shaped single subsidiary block is connected on the overall area. The moment motion of the subsidiary holders due to the flectional vibration of the piezoelectric ceramic vibrator increases and the flectional motion thereof becomes larger. However, when many subsidiary holders are employed, the problem, i.e., vibration in the horizontal direction is suppressed. Also, from a viewpoint of heat radiation, since a space is formed between the subsidiary holders in the case of the configuration of FIG. 13, the number of portions of the ceramic vibrators which come into contact with air is increased; hence, the heat radiation efficiency is not lowered. That the heat radiation efficiency is favorable means that any problem does not easily occur even if the piezoelectric actuator is operated with high power.

Fourth Exemplary Embodiment

The piezoelectric actuator of the present invention is not restricted by the exemplary embodiments above, but may be configured as shown in FIG. 14. A piezoelectric actuator 54A of FIG. 14(a) includes a subsidiary holder 83 including a single member, and the subsidiary holder 83 includes a slit 83a on the lower surface side, the slit 83a extending in the Y direction in the drawing. As a result, the subsidiary holder 83 comes into contact with the elastic body 14 at two locations sandwiching the slit 83a.

A piezoelectric actuator 54B of FIG. 14(b) is implemented by further modifying the configuration above, and two slits 83a are disposed in a subsidiary holder 83'. In a piezoelectric actuator 54C of FIG. 14(c), two slits 83a are disposed also on the upper surface side of a subsidiary holder 83". On the basis of the configurations of FIGS. 14(a) and 14(b), it is possible to consider as follows. That is, it is only necessary that the slit 83a is formed on an outer circumferential surface of the subsidiary holder, the surface being in contact with the piezoelectric ceramic vibrator 15 and/or the elastic body 14.

Fifth Exemplary Embodiment

The piezoelectric actuator of the present invention may be configured as shown in FIG. 15 in which a through hole 93a is arranged in a block-shaped subsidiary holder 93 disposed between the vibrator 15 and the elastic body 14. Naturally, the slit described above may be arranged in the subsidiary holder 93.

Sixth Exemplary Embodiment

The piezoelectric actuator of the present invention is not restricted by the exemplary embodiments above, but may be configured as shown in FIG. 16. A piezoelectric actuator 56 shown in FIG. 16(c) includes a piezoelectric ceramic vibrator 25, a holder 12 to hold an edge thereof, and an elastic body 14, and further two subsidiary holders 13.

In the configuration of the exemplary embodiment, there is adopted the piezoelectric ceramic vibrator 25 which differs in structure from the exemplary embodiments above; piezoelectric ceramic plates 26 and 27 are pasted onto both surfaces of the vibrator 25, leaving areas 28a and 28b on both edge sections of one shim plate 28 (reference is to be made to FIG. 4(a)). The subsidiary ceramic vibrator 25 is held by the holder 12 on the side of the area 28a in a cantilevered fashion as shown in (b) and (c) of the drawing.

One of the subsidiary holders 13 is disposed between the piezoelectric ceramic plate 26 and the elastic plate 14 as in the first exemplary embodiment and the like. The other one thereof is arranged between the shim plate 28 and the elastic body 14. The upper and lower surfaces respectively of the holders 13 are respectively adhered onto the ceramic plate 26, the elastic body 14, and the shim plate 28.

According to the configuration of the exemplary embodiment, since the subsidiary holders 13 are disposed as in the exemplary embodiments above, the quantity of transmitted vibration transmitted from the vibrator to the elastic body is increased. In addition, since the subsidiary holders 13 are disposed between the shim plate 28 and the elastic body 14, an advantage is obtained as below. That is, even if an electronic device, e.g., a cellular or a PDA fell down onto, for example, a floor surface, impact force occurring in this situation can be absorbed through the bending of the shim member having low rigidity, which hence leads to an advantage to prevent destruction of the piezoelectric ceramic plate made of a brittle material, and there can be implemented a highly reliable vibration source.

Seventh Exemplary Embodiment

The piezoelectric actuator of the present invention is not restricted by the exemplary embodiments above, but may be of a configuration of lamination type as shown in FIG. 17.

A piezoelectric actuator 61 of FIG. 17(a) is configured such that two piezoelectric ceramic vibrators 15 are held by a single holder 62 in a cantilevered fashion and the holder 62 is attached onto the elastic body 14. A subsidiary holder 13 is arranged between the elastic body 14 and the vibrator 15 and between the vibrators 15. A piezoelectric actuator 62 of FIG. 17(b) is configured such that three piezoelectric ceramic vibrators 15 are held by a holder 62' and the subsidiary holder 13 is arranged between the elastic body 14 and the vibrator 15 and between the vibrators 15.

In addition, as in a piezoelectric actuator 63 of FIG. 17(c), respective piezoelectric ceramic vibrators may differ in size from each other. In the actuator of FIG. 17(c), a lower vibrator 15 is relatively long and an upper vibrator 15' is relatively short.

FIG. 18 shows a configuration of lamination type not including a subsidiary holder in which two vibrators 315 are held by a holder 302 in a cantilevered fashion and the holder 302 is attached onto the elastic body 304. According to the configuration, in a situation wherein vibration is transmitted from a plurality of piezoelectric ceramic vibrators 315 via the holder 302 to the elastic body 304, exciting force is expectedly increased in proportion to the number of piezoelectric ceramic vibrators as compared with a case wherein a single piezoelectric ceramic vibrator is used.

However, actually, the exciting force expectedly obtained in proportion to the number of piezoelectric ceramic vibrators is not attained. The reason is as follows. That is, since the height of the holder 302 becomes higher due to installation of a plurality of ceramic vibrators, the influence of the horizontal component of force of inertia due to vibration of piezoelectric ceramic vibrators becomes stronger. Hence, the holder 302 easily deflects in the horizontal direction in the proximity of a connecting section between the holder 302 and the piezoelectric ceramic vibrators 315, which deteriorates the transmission efficiency of vibration energy to the elastic body 304. Also, since the respective piezoelectric vibrators differ in the position of connection to the holder 802 from each other in the direction of the height of the holder, the contribution of force of inertia varies between the respective piezoelectric ceramic vibrators; there occurs interference between vibrations of the respective vibrators and force of their vibrations is lowered.

In contrast thereto, according to the configuration of the present embodiment, there are disposed the subsidiary holders 13, which hence suppresses the horizontal deflection of the holder 62 by the horizontal component of force of inertia due to vibrations of the piezoelectric ceramic vibrators. In addition, in association with increase in the area to be brought into contact with the elastic body 14, the vibration transmission efficiency is improved. Moreover, since the respective piezoelectric ceramic vibrators arranged at upper and lower positions are mutually excited via the subsidiary holders 13, it is possible for the respective vibrators to conduct stable operation. Resultantly, as compared with the related art, the final exciting force is highly increased.

EXAMPLE

Next, description will be given in detail of the present invention on the basis of examples. Incidentally, "length" in the following examples indicates the length in the X direction exemplified in FIG. 4; similarly, "width" indicates the length in the Y direction and "height" indicates the length in the Z direction.

Example 1

For example 1, there are produced piezoelectric actuators 50A to 50C of first exemplary embodiment type shown in FIGS. 4 to 6.

For the piezoelectric ceramic plates 16 and 17, a 25 mm long, 5 mm wide, and 0.2 mm thick ceramic plate is prepared, and an Ag electrode is formed on both principal surfaces and a polarizing process is conducted. For the shim plate 18, a plate of bronze phosphorus having a 28 mm long, 5 mm wide, and 0.1 mm thick contour is prepared. The two piezoelectric ceramic plates are adhered onto both surfaces of the shim plate 18 using epoxy resin, and predetermined electric wiring is formed to thereby produce the piezoelectric ceramic vibrator 15.

As the holder 12, there is prepared a 5 mm wide, 4 mm long, and 10 mm high resin member made of ABS resin. Epoxy resin is adopted to adhere the vibrator 15 onto the holder 12. The holder 12 is constructed such that the holder 12 is projected toward an electronic device to which vibration is transmitted and the bottom surface thereof is flat.

For the subsidiary holder 13, there are prepared three silicone rubber pieces each having a 5 mm wide, 4 mm long, and 2 mm high contour. By changing the silicone rubber arranging position, three piezoelectric actuators 50A to 50C are manufactured. In the actuator 50A, the subsidiary holder 13 is disposed at a position such that the edge surface (the surface opposing the holder 12) of the subsidiary holder 13 is aligned with those of the piezoelectric ceramic plates 16 and 17 as shown in FIG. 4 (namely, a position 0 mm apart from the edge surface).

In the actuator 50B of FIG. 5, the subsidiary holder 13 is arranged at a position 5 mm apart from the edge surfaces of the ceramic plates 16 and 17. In the actuator 50C of FIG. 6, the subsidiary holder 13 is arranged at a position 10 mm apart from the edge surfaces of the ceramic plates 16 and 17.

In the configuration of either one of the actuators 50A to 50C, the bottom surface of the subsidiary holder matches in the height with that of the holder; and the holder and the subsidiary holder are projected toward the elastic body surface which propagates vibration.

The piezoelectric actuator configured in this way is installed in an electronic device (cellular) as shown in FIG. 9. The configuration itself of this cellular 70 is generally used in the related art; a liquid-crystal display 71 and input keys are disposed on one surface of a housing 72; and an antenna 74 is arranged on an edge surface on the side of the display 74. As shown in a cross-sectional diagram of FIG. 9(b), a battery 76 and an electronic circuit board 79 are disposed in the cellular. The piezoelectric actuator is installed at a position between the display and the antenna and on an inner surface of the housing 72 as indicated by a reference numeral 77. The holder and the subsidiary holder of the piezoelectric actuator are connected to each other at a position (on a liquid-crystal display protecting plate which is on the liquid-crystal display and which forms part of the housing) indicated by a reference numeral 75.

Incidentally, for the housing 72, a 1 mm thick stainless material is used. The housing 72 has a 50 mm long, 50 mm wide, and 20 mm thick external contour. An adhesive material is employed to fix the piezoelectric actuator.

To verify an advantage of the present invention, vibrational acceleration of the cellular is measured by applying an alternating-current electric field of 100 Hz and an effective value of 5 V to the piezoelectric actuator. The measurement is conducted at positions indicated by reference numerals A and B in FIG. 9(b); position A is almost at the center of the display and position B is a position on the rear surface of the cellular corresponding to position A. A vibrational speedometer of laser type is adopted for the measurement. Through the measurement at two positions, the transmitted vibration to the entire housing is quantized.

In addition to the vibrational acceleration, the sound pressure is also measured. The sound pressure is measured by applying an alternating-current electric field of 1 kHz and an effective value of 5 V to the piezoelectric actuator and by placing a microphone at a distance of 10 cm from the two positions A and B in the vertical direction to the housing. As a result, the acoustic performance to convert vibrations into sound waves is quantized.

Using the quantity of vibration and the sound pressure measured as above and the piezoelectric actuator as a reference or a denominator, the ratio between the measured values is represented as the rated vibration quantity and the rated sound pressure.

Table 1 shows the results. As compared with the related art, the rated vibration quantity and the rated sound pressure are improved at least 30% according to the technique of the present invention, and its advantage is unquestionable.

TABLE 1

|  | Rated vibration speed | | Rated sound pressure | |
| --- | --- | --- | --- | --- |
|  | Position A | Position B | Position A | Position B |
| Related art Present invention | 1 | 1 | 1 | 1 |
| 50A | 2.0 | 1.90 | 2.2 | 2.3 |
| 50B | 1.72 | 1.70 | 1.80 | 1.75 |
| 50C | 1.30 | 1.31 | 1.41 | 1.45 |

Example 2

For example 2, there are produced two piezoelectric actuators 50D and 50E which are different in the subsidiary holder length from each other as shown in FIGS. 8(*a*) and 8(*b*). Incidentally, these actuators differ from each other only in the contour of the subsidiary holder, and the other constituent elements employed therein are equal to those produced for the above example. Specifically, as the fundamental configuration, the piezoelectric actuator 50A produced for the preceding example is also adopted.

In the configuration, the subsidiary holders of the respective piezoelectric actuators 50, 50D, and 50E have contours as follows.

Actuator 50 (subsidiary holder 13) . . . width 5 mm, length 4 mm, height 2 mm Actuator 50D (subsidiary holder 13') . . . width 5 mm, length 8 mm, height 2 mm Actuator 50E (subsidiary holder 13") . . . width 5 mm, length 12 mm, height 2 mm The material of each of the subsidiary holders 13, 13', and 13" is silicone rubber. In the piezoelectric actuators 50D and 50E, the subsidiary holders 13' and 13" are placed at positions such that the edge surfaces of the subsidiary holders are aligned with the edge surfaces of the piezoelectric ceramic plates 16 and 17 as in the actuator 50A of the above example. In this situation, as in example 1, the bottom surface of the subsidiary holder is aligned in height with that of the holder in a configuration in which the holder and subsidiary holder projects toward the housing to which vibration is to be transmitted.

Each of the piezoelectric actuators 50A, 50D, and 50E manufactured as above is installed in a cellular (reference is to be made to FIG. 9) and the vibration quantity and the sound pressure are measured in the same way as for example 1. Table 2 shows results of the measurement. According to the technique of the present invention, both of the vibration quantity and the sound pressure are improved at least 20% and hence the advantage of the present invention is unquestionable.

TABLE 2

|  | Rated vibration speed | | Rated sound pressure | |
| --- | --- | --- | --- | --- |
|  | Position A | Position B | Position A | Position B |
| Related art Present invention | 1 | 1 | 1 | 1 |
| 50A | 2.0 | 1.90 | 2.2 | 2.3 |
| 50D | 1.43 | 1.47 | 1.52 | 1.49 |
| 50E | 1.25 | 1.21 | 1.25 | 1.23 |

Example 3

For example 3, piezoelectric actuators 54A and 54B shown in FIG. 14 and a piezoelectric actuator 52B of FIG. 12 are produced. Incidentally, these actuators differ from each other only in the contour of the subsidiary holder, and the other constituent elements employed therein are equal to those produced for example 1 described above.

In the configuration, the subsidiary holders of the respective actuators have contours as follows.

Actuator 54A (subsidiary holder 83) . . . External contour: width 5 mm, length 8 mm, height 2 mm/slit: one 2 mm wide and 0.5 mm deep slit 83*a* is disposed at the center of the bottom (incidentally, the slit 83*a* is arranged in a straight line from the surface of the subsidiary holder on the front side of the drawing to the surface thereof on the deep side thereof (not shown)).

Actuator 54B (subsidiary holder 83') . . . External contour: width 5 mm, length 8 mm, height 2 mm/slits: two 2 mm wide and 0.5 mm deep slits 83*a* are disposed (incidentally, each of the slits 83*a* is arranged in a straight line from the surface of the subsidiary holder on the front side of the drawing to the surface thereof on the deep side thereof (not shown)). More specifically, each slit 83*a* is arranged at a position apart 2 mm from the central position of the bottom of the subsidiary holder.

In this regard, also in each of the actuators 54A and 54B, the bottom surface of the subsidiary holder is aligned in height with that of the holder as in the above exemplary embodiments.

Actuator 52B . . . External contour: width 7 mm, length 4 mm, height 10 mm/through hole: width 7 mm, length 2 mm, height 6 mm/material: a silicone rubber integrated member (holder member) is prepared. This member is produced by monoblock molding. A vibrator 15 like that of example 1 above is attached onto the holder member to produce the piezoelectric actuator 52B.

For the evaluation, each of the four piezoelectric actuators is coupled with the cellular of FIG. 9 in the same way as for example 1 to achieve evaluation in a way similar to that of example 1. Table 3 shows results of the evaluation. In each of the configuration in accordance with the present invention, the vibration quantity and the sound pressure are improved at least 40%.

TABLE 3

|  | Rated vibration speed | | Rated sound pressure | |
| --- | --- | --- | --- | --- |
|  | Position A | Position B | Position A | Position B |
| Related art Present invention | 1 | 1 | 1 | 1 |
| 54A | 1.45 | 1.41 | 1.47 | 1.49 |
| 54B | 1.50 | 1.53 | 1.55 | 1.57 |
| 52B | 2.20 | 2.10 | 2.30 | 2.25 |

Example 4

For example 4, there is produced a piezoelectric actuator 56 shown in FIG. 16.

For the piezoelectric ceramic plates 26 and 27, there is prepared a 25 mm long, 5 mm wide, and 0.2 mm thick ceramic plate, and an Ag electrode is formed on both principal surfaces and a polarizing process is conducted. For the shim plate 28, a plate of bronze phosphorus having a 35 mm long, 5 mm wide, and 0.1 mm thick contour is prepared. The two piezoelectric ceramic plates are adhered onto both surfaces of the shim plate 28 using epoxy resin and predetermined electric wiring is formed to thereby produce the piezoelectric ceramic vibrator 25. Finally, an area 28b of the shim plate 28 is projected 7 mm from edge surfaces of the ceramic plates 26 and 27 in the configuration.

For the holder 12, there is prepared the same item as for example 1. That is, there is prepared a member made of ABS resin having a 5 mm wide, 4 mm long, and 10 mm high contour. Each subsidiary holder 13 is made of silicone rubber and has a 5 mm wide, 4 mm long, and 2 mm high contour.

The two subsidiary holders are connected to a position of an edge section of the piezoelectric ceramic plate on the holder 12 side and a position of an edge section of the bronze phosphorus plate (28) as shown in FIG. 16(c). In this situation, the bottom surface of the subsidiary holder is aligned in height with that of the holder.

For evaluation, in the same way as for example 1, each of the four piezoelectric actuators is connected via the holder and the subsidiary holders to the cellular of FIG. 9 and then the evaluation is achieved in a way similar to that of example 1. FIG. 4 shows results of the evaluation. In each of the configuration in accordance with the present invention, the vibration quantity and the sound pressure are improved at least 50%.

TABLE 4

|  | Rated vibration speed | | Rated sound pressure level | |
|---|---|---|---|---|
|  | Position A | Position B | Position A | Position B |
| Related art | 1 | 1 | 1 | 1 |
| Present invention 56 | 1.63 | 1.57 | 1.70 | 1.67 |

Example 5

For example 5, there is produced a piezoelectric actuator 61 of lamination type shown in FIG. 17, and there is separately configured an actuator for comparison. For each piezoelectric ceramic vibrator 15, there is prepared the same member as that produced in example 1 above.

For the holder 62, there is prepared a 5 mm wide, 4 mm long, and 10 mm high resin member made of ABS resin in which grooves (not indicted by a reference numeral) are formed with a distance of 2 mm therebetween in the height direction. The respective vibrators 15 are fixed into the grooves using epoxy resin.

For the subsidiary holder 13, there is prepared a subsidiary holder of silicone rubber having a 5 mm wide, 4 mm long, and 2 mm high contour produced through monoblock molding of a resin molding method.

[Comparative Actuator: Related Art Multilayered]

The item which is produced as above and which is configured such that only two vibrators 15 are fixed onto the holder 62 (i.e., no subsidiary holder is included in the configuration) is prepared as a comparative actuator (to be called "related art multilayered").

[Piezoelectric Actuator 61]

In the configuration produced as above (corresponding to the related art multilayered), the subsidiary holder 13 is disposed at a position between the vibrators 15 and a position between the vibrator 15 and the elastic body to thereby construct the piezoelectric actuator 61 in accordance with the present invention. The subsidiary holder 13 is adhered using acryl-based adhesive. In this case, the bottom surface of the subsidiary holder is aligned in height with that of the holder.

To confirm the advantage of improvement in exciting force of the configuration in accordance with the present invention, there is produced the related art piezoelectric actuator (to be referred to as related art single layered) described for example 1.

For evaluation, as for example 1, the evaluation is conducted on the basis of the vibration speed and the sound pressure of the single-layered piezoelectric actuator of the related art. FIG. 5 shows results of the evaluation. In either one of the configurations in accordance with the present invention, the characteristics are improved at least 260% as compared with the single-layered piezoelectric actuator of the related art. However, in the single-layered piezoelectric actuator of the related art, there is obtained a characteristic improvement of only about 130%. This clearly indicates that a considerable loss of vibration energy appears in the related art configuration; in contrast thereto, the vibration is efficiently propagated in the configurations in accordance with the present invention.

TABLE 5

|  | Rated vibration speed | | Rated sound pressure level | |
|---|---|---|---|---|
|  | Position A | Position B | Position A | Position B |
| Related art a Single layered | 1 | 1 | 1 | 1 |
| Related art Multilayered | 1.32 | 1.27 | 1.35 | 1.33 |
| Present invention 61 | 2.70 | 2.60 | 2.75 | 2.72 |

Example 6

In the cellular (reference is to be made to FIG. 9) in which the piezoelectric actuator described in example 1 is mounted, vibration is applied to measuring points A and B by use of an vibration exciter to measure a voltage value resultantly occurring in the actuator. Also, a speaker is placed at a distance apart 10 cm from each measuring point to emit sound toward the cellular to measure a voltage value resultantly occurring in the piezoelectric actuator. The vibration applied to the cellular is 100 Hz and has a vibration speed of 0.1 m/s, and the sound wave is 1 kHz and has a sound pressure level of 90 dB.

In this situation, the voltage value occurring in the piezoelectric actuator is measured as rated vibration sensitivity and rated sound pressure sensitivity by using the related art as a reference; FIG. 6 shows results of the measurement. The results are similar to those of the rated vibration speed and the rated sound pressure of example 1; it is indicated that the actuator has reversibility as a vibration source and a vibration sensor as well as that the present invention is highly advantageous. As described by referring to the examples, in accordance with the present invention, the exciting force of the piezoelectric actuator is improved, a large vibration quantity is obtained when the actuator is applied to an electronic device, and the present invention has a high industrial value.

TABLE 6

| | Rated vibration sensitivity | | Rated sound pressure sensitivity | |
|---|---|---|---|---|
| | Position A | Position B | Position A | Position B |
| Related art | 1 | 1 | 1 | 1 |
| Present invention | | | | |
| 50A | 2.23 | 1.92 | 2.24 | 2.31 |
| 50B | 1.74 | 1.72 | 1.85 | 1.76 |
| 50C | 1.33 | 1.31 | 1.41 | 1.43 |

Example 7

In the cellular (reference is to be made to FIG. 9) in which the piezoelectric actuator described in example 5 is mounted, vibration is applied to measuring points A and B by use of a vibration exciter to measure a voltage value resultantly occurring in the actuator in the same way as for the example described above. Also, a speaker is placed at a distance apart 10 cm from each measuring point to emit sound toward the cellular to measure a voltage value resultantly occurring in the piezoelectric actuator. The vibration applied to the cellular is 100 Hz and has a vibration speed of 0.1 m/s, and the sound wave is 1 kHz and has a sound pressure level of 90 dB.

In this situation, the voltage value occurring in the piezoelectric actuator is measured as rated vibration sensitivity and rated sound pressure sensitivity by using the related art as a reference; FIG. 7 shows results of the measurement. The results are similar to those of the rated vibration speed and the rated sound pressure of example 5; it is indicated that the actuator has reversibility as a vibration source and a vibration sensor as well as that the present invention is highly advantageous. As described by referring to the examples, in accordance with the present invention, the exciting force of the piezoelectric actuator and the sensor sensitivity are improved, and the present invention has a high industrial value to be applied to electronic devices.

BRIEF DESCRIPTION OF DRAWINGS

FIG. 1 is a perspective view showing a configuration example of a conventional piezoelectric actuator.

FIG. 9 is a diagram showing an example of a cellular in which a piezoelectric actuator of the present invention is mountable.

FIG. 10 is a perspective view showing a configuration of a piezoelectric actuator in a second exemplary embodiment.

FIG. 16 is a perspective view showing a configuration of a piezoelectric actuator in a sixth exemplary embodiment.

FIG. 17 is a perspective view showing a configuration of a piezoelectric actuator in a seventh exemplary embodiment.

Figure 2:
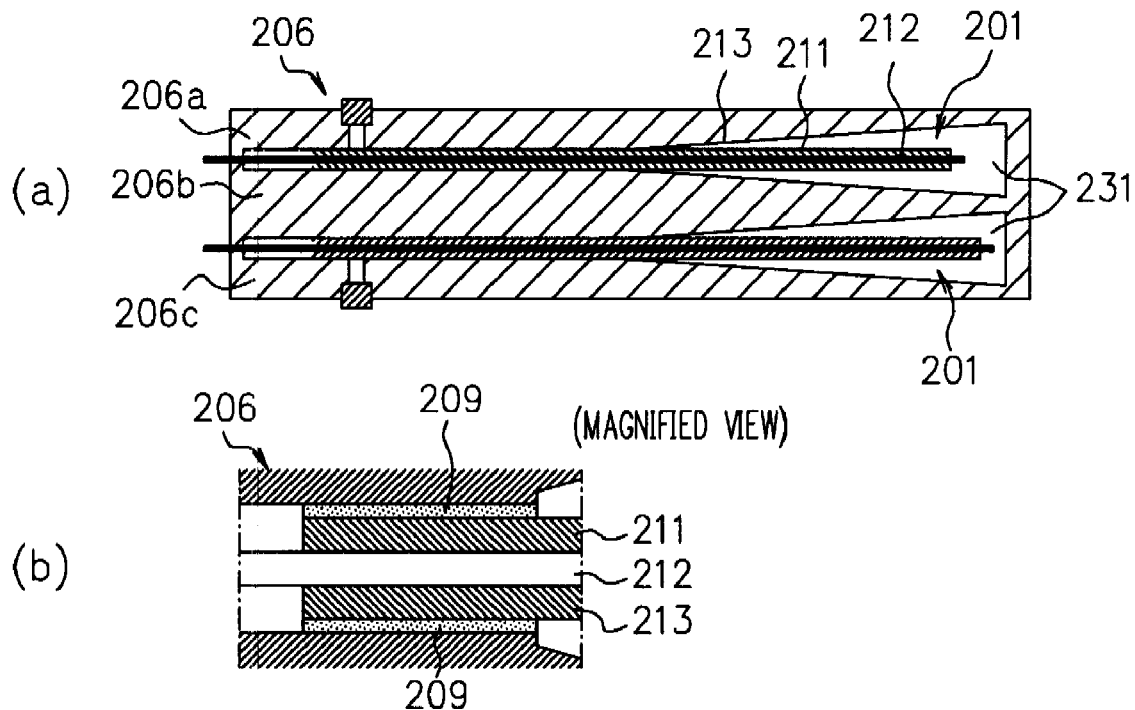
FIG. 2 is a cross-sectional diagram showing another conventional example.
Figure 3:
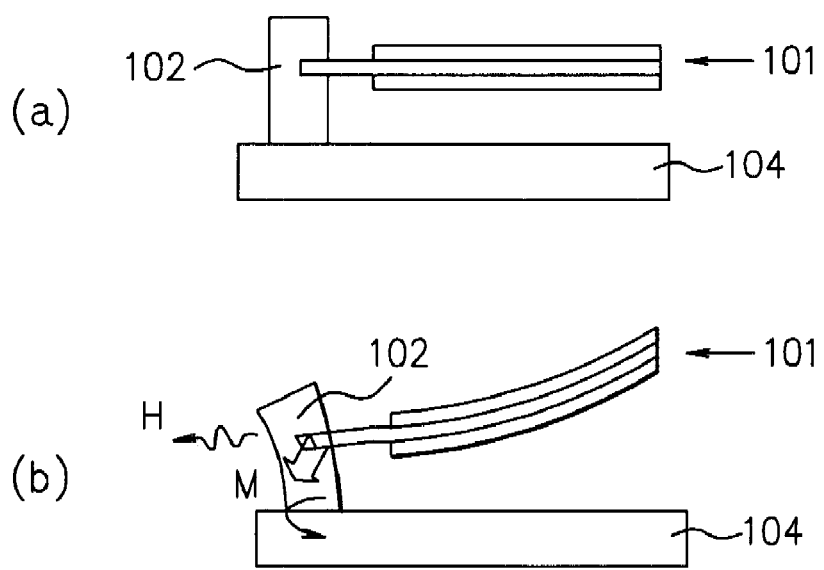
FIG. 3 is a side view to explain a state of operation of the piezoelectric actuator of FIG. 1.
Figure 4:
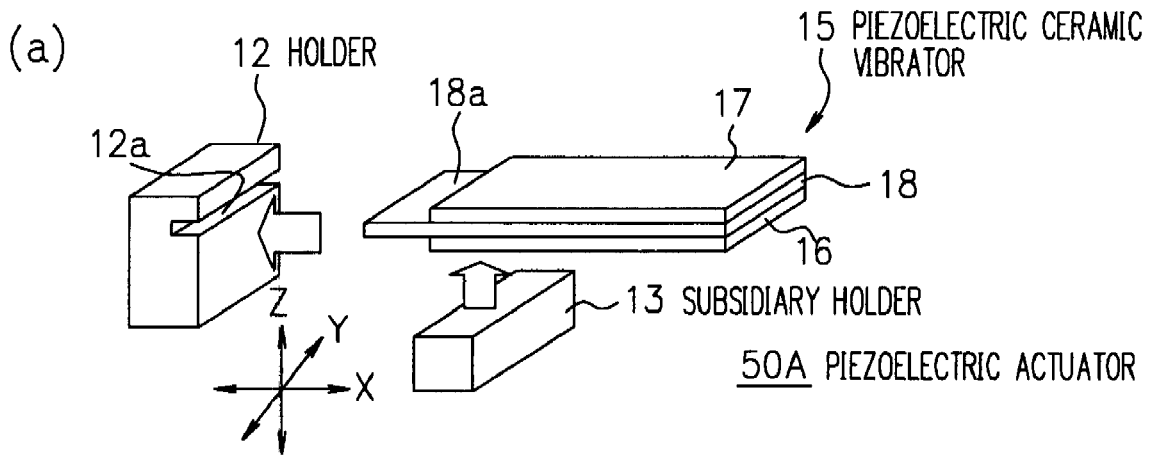
FIG. 4 is a perspective view showing a configuration example of a piezoelectric actuator in a first exemplary embodiment.
Figure 5:
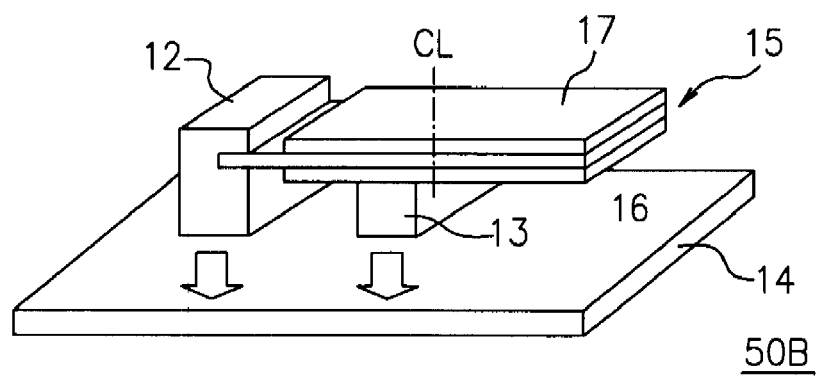
FIG. 5 is a perspective view showing a configuration of another piezoelectric actuator in the first exemplary embodiment.
Figure 6:
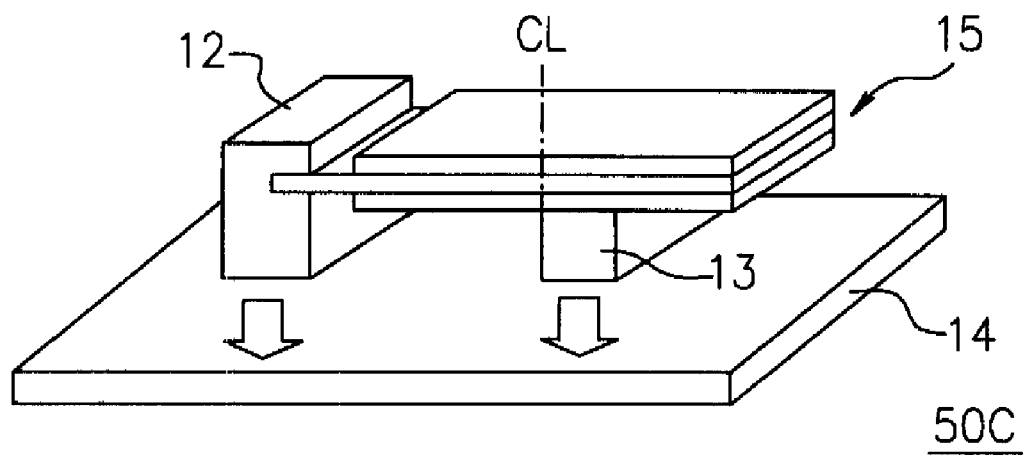
FIG. 6 is a perspective view showing a configuration still another piezoelectric actuator in the first exemplary embodiment.
Figure 7:
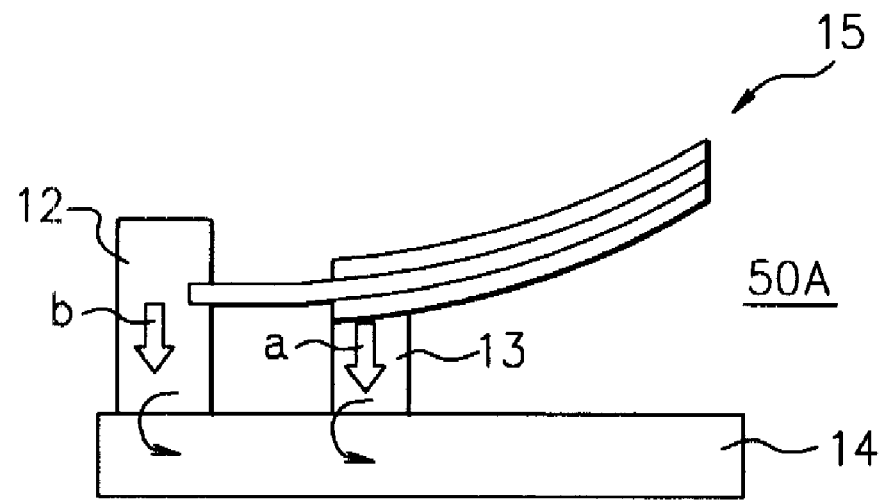
FIG. 7 is a schematic diagram to explain operation of the piezoelectric actuator of FIG. 4.
Figure 8:
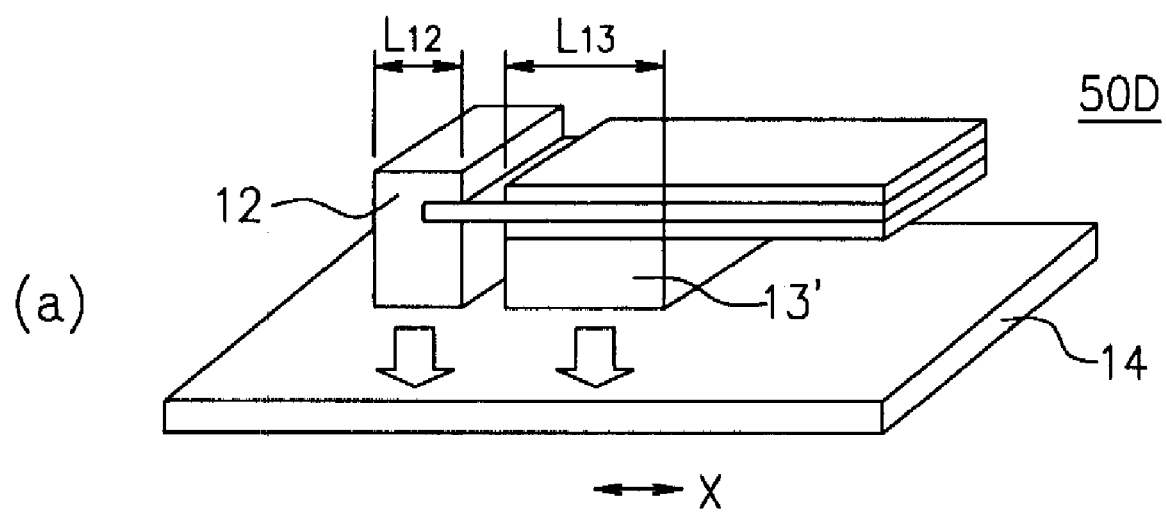
FIG. 8 is a perspective view showing a configuration in which subsidiary holders have different lengths.
Figure 8:
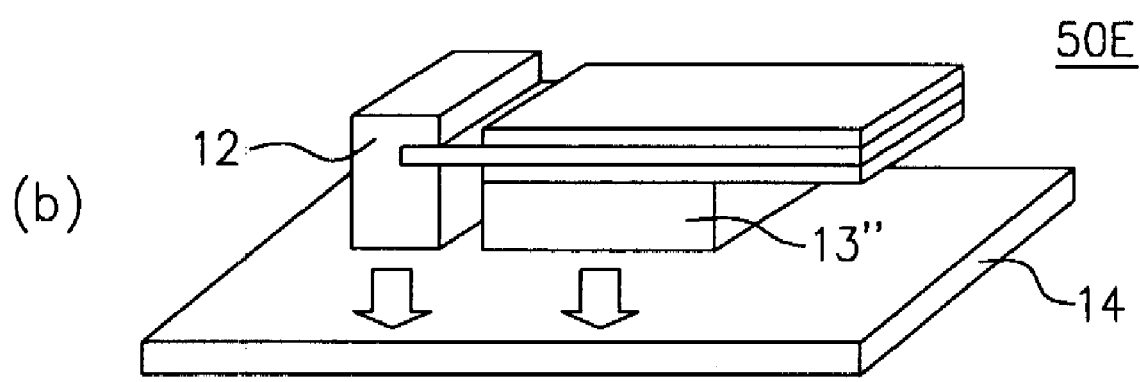
Figure 11:
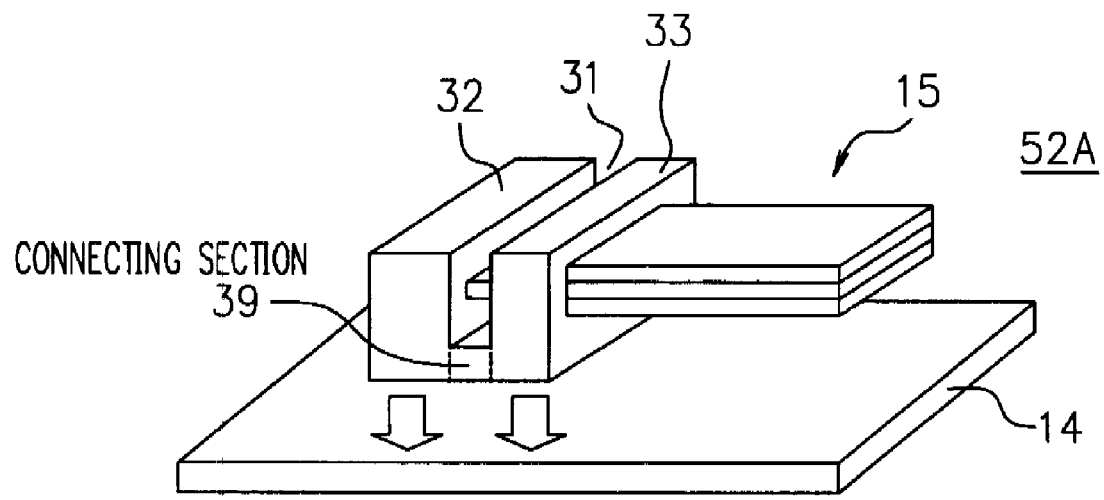
FIG. 11 is a perspective view showing a configuration of another piezoelectric actuator in the second exemplary embodiment.
Figure 12:
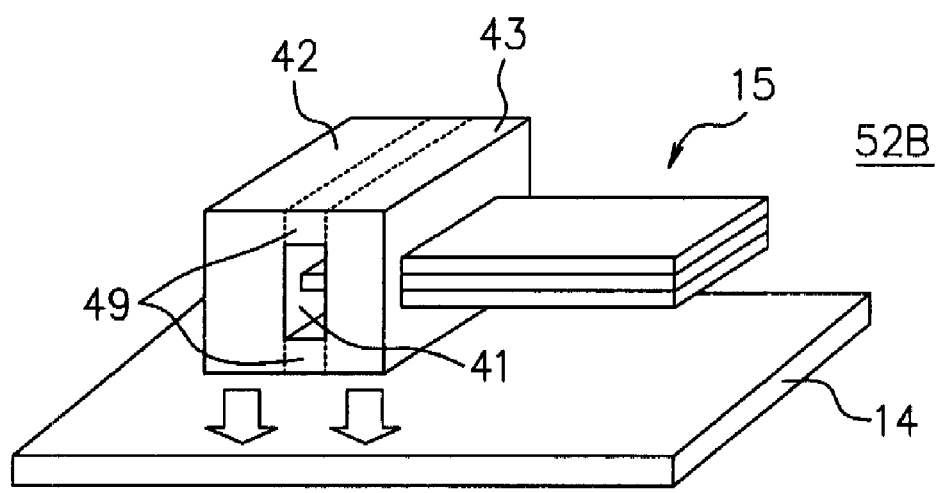
FIG. 12 is a perspective view showing a configuration of further another piezoelectric actuator in the second exemplary embodiment.
Figure 13:
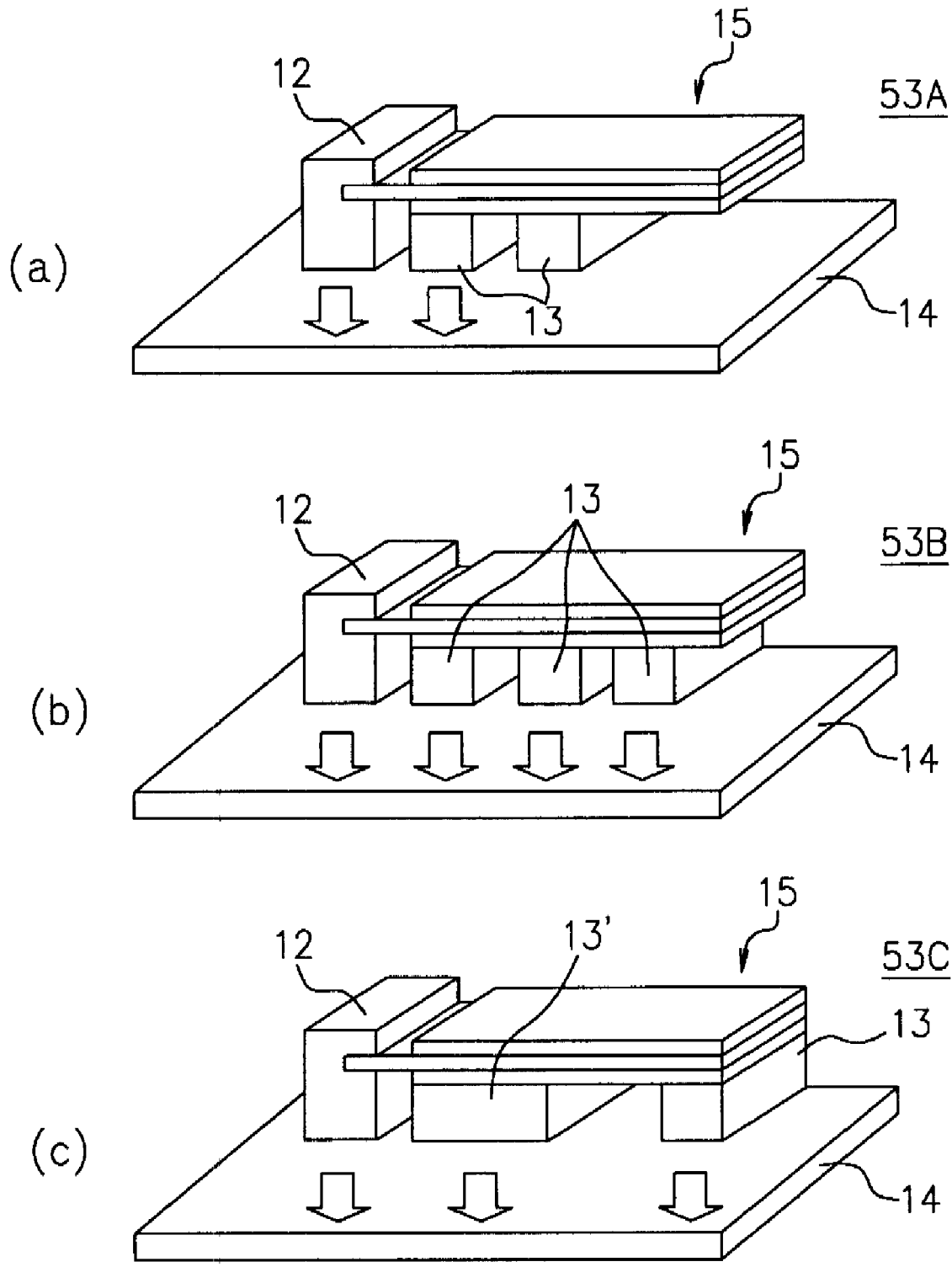
FIG. 13 is a perspective view showing a configuration of a piezoelectric actuator in a third exemplary embodiment.
Figure 14:
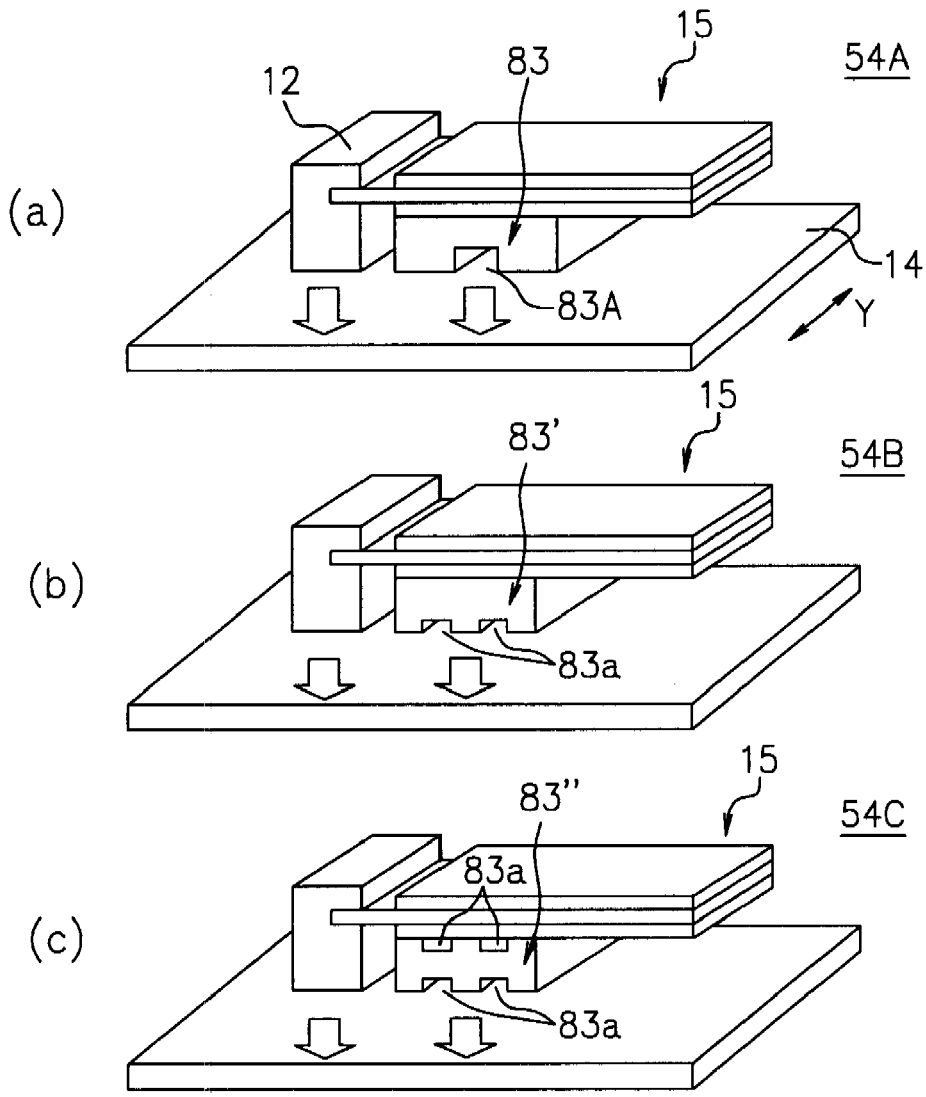
FIG. 14 is a perspective view showing a configuration of a piezoelectric actuator in a fourth exemplary embodiment.
Figure 15:
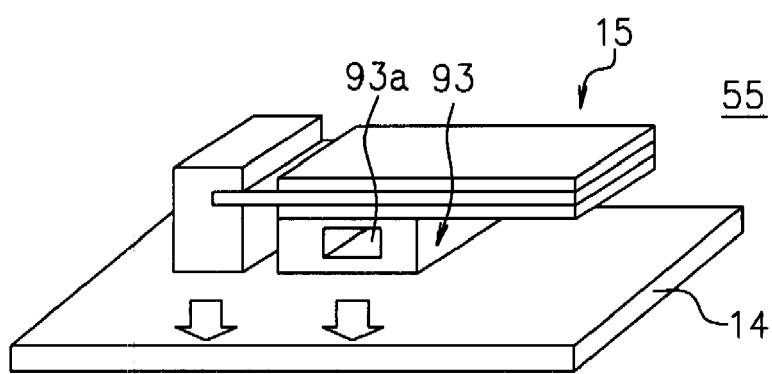
FIG. 15 is a perspective view showing a configuration of a piezoelectric actuator in a fifth exemplary embodiment.
Figure 18:
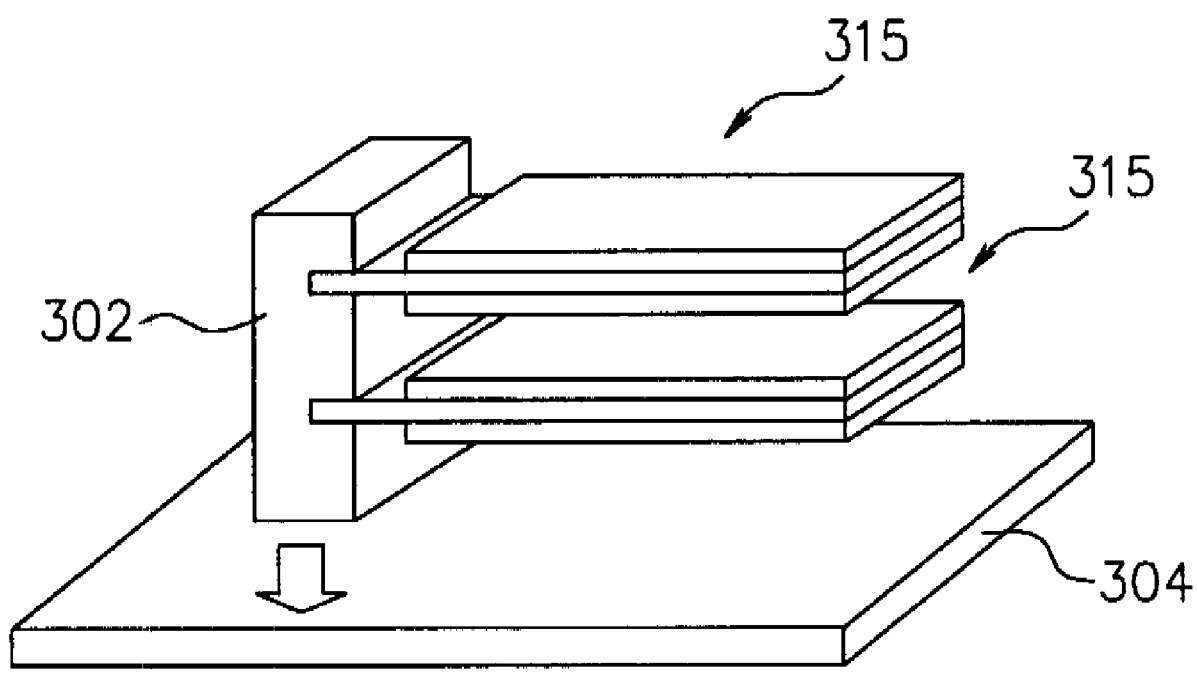
FIG. 18 is a perspective view showing a piezoelectric actuator as a reference example in a lamination-type configuration in which no subsidiary holder is arranged.

DESCRIPTION OF REFERENCE NUMERALS 11, 21, 31, 41 Gap
12, 22, 32, 42, 62 Holder
13, 23, 33, 43, 83, 93 Subsidiary holder
14 Elastic body
15, 25 Piezoelectric ceramic vibrator
16, 17, 26, 27 Piezoelectric ceramic plate
18, 28 Shim plate
18a Area
39, 49 Connecting section
41 Through hole
50 to 56, 61 to 63 Piezoelectric actuator
70 Cellular
83a Slit

The invention claimed is:

1. A piezoelectric actuator comprising:
a piezoelectric ceramic vibrator in which a piezoelectric layer is arranged on both surfaces of a shim body; and
a holder for holding an edge section of the piezoelectric ceramic vibrator,
wherein deflective vibration of the piezoelectric ceramic vibrator is propagated via the holder to an object; and at least one subsidiary holder is disposed, at a position between the piezoelectric ceramic vibrator and the object when the holder is attached onto the object, with a gap between the subsidiary holder and the holder, and part of the deflective vibration of the piezoelectric ceramic vibrator is propagated via the subsidiary holder to the object,
wherein the holder and the subsidiary holder are mutually connected by a connecting member to each other and the gap is secured in a periphery of a root section of the piezoelectric ceramic vibrator.

2. The piezoelectric actuator in accordance with claim 1 characterized in that a surface of the subsidiary holder opposing the holder is placed at a position nearer, in a length direction from the holding section of the piezoelectric ceramic vibrator to an end section thereof, to the holder relative to a central line of the piezoelectric layer in the length direction.

3. The piezoelectric actuator in accordance with claim 1 characterized in that the subsidiary holder is entirely disposed at a position nearer, in a length direction from the holding section of the piezoelectric ceramic vibrator to an end section thereof, to the holder relative to a central line of the piezoelectric layer in the length direction.

4. The piezoelectric actuator in accordance with claim 1, wherein in the subsidiary holder, a slit is formed on a surface thereof to be brought in contact with the piezoelectric ceramic vibrator and/or on a surface thereof to be brought in contact with the object.

5. The piezoelectric actuator in accordance with claim 1, wherein a through hole is formed in the subsidiary holder.

6. The piezoelectric actuator in accordance with claim 1, wherein the subsidiary holder is attached onto the shim body on an edge side of the piezoelectric ceramic vibrator.

7. The piezoelectric actuator in accordance with claim 1, wherein two or more of the piezoelectric ceramic vibrators are held by the holder and a second subsidiary holder other than the subsidiary holder is arranged between the ceramic vibrators mutually adjacent to each other.

8. The electronic device characterized in that the piezoelectric actuator in accordance with claim 1 is installed as a vibration source therein to vibrate a housing as the object.

9. The electronic device characterized in that a piezoelectric actuator in accordance with claim 1 is installed as a vibration source therein, the device including a function to convert vibration of a housing into a sound wave.

10. The electronic device characterized in that a piezoelectric actuator in accordance with claim 1 is installed therein, the device including a function to convert vibration occurring in a housing into a voltage by the piezoelectric actuator.

11. The electronic device characterized in that a piezoelectric actuator in accordance with claim 1 is installed therein, the device including a function to convert, by use of a housing as a sound receiving surface, a sound wave into a voltage by the piezoelectric actuator.

* * * * *